(12) United States Patent
Suzuki et al.

(10) Patent No.: US 8,111,061 B2
(45) Date of Patent: Feb. 7, 2012

(54) MULTI-OUTPUT DETERMINATION CIRCUIT

(75) Inventors: Kouji Suzuki, Shioya (JP); Kenichi Takebayashi, Shioya (JP); Kazutaka Senoo, Shioya (JP)

(73) Assignee: Keihin Corporation, Tokyo (JP)

( * ) Notice: Subject to any disclaimer, the term of this patent is extended or adjusted under 35 U.S.C. 154(b) by 330 days.

(21) Appl. No.: 12/481,152

(22) Filed: Jun. 9, 2009

(65) Prior Publication Data

US 2009/0309575 A1    Dec. 17, 2009

(30) Foreign Application Priority Data

Jun. 11, 2008    (JP) ................. 2008-152666

(51) Int. Cl.
G01R 5/16 (2006.01)
G01R 31/02 (2006.01)

(52) U.S. Cl. ................. 324/140 R; 324/762.01

(58) Field of Classification Search ............. 324/140 R, 324/762.01, 103 P, 115–116, 121 R; 327/51–63
See application file for complete search history.

(56) References Cited

U.S. PATENT DOCUMENTS

| | | | | |
|---|---|---|---|---|
| 4,540,974 A | * | 9/1985 | Schanne et al. ............. | 341/118 |
| 4,641,246 A | * | 2/1987 | Halbert et al. ............... | 341/163 |
| 4,654,587 A | * | 3/1987 | Murphy ..................... | 324/103 P |
| 5,416,432 A | * | 5/1995 | Lewis et al. ................. | 327/60 |
| 5,491,434 A | * | 2/1996 | Harnishfeger et al. ........ | 327/50 |
| 6,107,840 A | * | 8/2000 | Cameron et al. ............ | 327/62 |
| 7,161,392 B2 | * | 1/2007 | Nakamura .................. | 327/58 |
| 7,382,166 B1 | * | 6/2008 | Ide .............................. | 327/62 |

FOREIGN PATENT DOCUMENTS

| | | | |
|---|---|---|---|
| JP | 64-019914 A | 1/1989 | |
| JP | 64-039227 A | 2/1989 | |

* cited by examiner

Primary Examiner — Huy Q Phan
Assistant Examiner — Joshua Benitez
(74) Attorney, Agent, or Firm — Westerman, Hattori, Daniels & Adrian, LLP

(57) ABSTRACT

An embodiment of the present invention provides a multi-output determination circuit that determines whether or not any one input voltage of a plurality of input voltages is equal to or higher than an upper-limit voltage value. This multi-output determination circuit includes a first diode-OR, upper-limit reference voltage generation means, and a first comparator. The first diode-OR includes a plurality of first diodes whose anodes are each connected to a respective one of the plurality of input voltages and whose cathodes are connected in common. The upper-limit reference voltage generation means has a first resistor, the first diode, and a second resistor that are connected in series between first and second power supply potentials, and generates an upper-limit reference voltage based on the voltage of the cathode of the first diode. The first comparator compares the output voltage of the first diode-OR with the upper-limit reference voltage.

9 Claims, 8 Drawing Sheets

MULTI-OUTPUT DETERMINATION CIRCUIT

BACKGROUND OF THE INVENTION

1. Field of the Invention

The present invention relates to a multi-output determination circuit that determines whether or not the levels of plural input signals are equal to or higher than an upper-limit value or equal to or lower than a lower-limit value.

2. Description of the Related Art

In electric vehicles such as electric cars and hybrid cars, a DC high voltage from a high-voltage battery is converted to an AC voltage, e.g. a three-phase AC voltage, by an inverter and a drive source electric machine is rotated by this three-phase AC voltage to thereby obtain the drive source of vehicle travelling. Furthermore, a hybrid vehicle is a car that employs a motor in addition to an engine as the drive source of its travelling, and the motor is driven to assist the engine and carry out regenerative braking of the motor.

In order to drive the motor with the optimum torque, based on the target torque, the U-, V-, and W-phase command voltages that should be applied to the motor are calculated from the detected values of the U-, V-, and W-phase currents detected by a phase current detection sensor and the motor angle detected by a motor angle readout sensor, and the motor is driven by PWM control via the inverter.

At this time, if the detected motor rotation angle is different from the actual angle because of a system malfunction attributed to e.g. the failure of the motor angle readout sensor, the phase voltages are applied to the motor and the motor is driven in the state in which the inductance of the armature of the motor is lower than the target inductance. Thus, an overcurrent flows to the motor. In addition, an overcurrent flows to the motor also because of a system malfunction attributed to trouble with a CPU (hardware and software) for controlling the motor. If an overcurrent flows, the motor temperature is increased and the motor is possibly damaged. Therefore, it is necessary to detect the overcurrent and stop the motor.

Examples of the related art for detecting the overcurrent of the motor include Japanese Patent Laid-Open No. Sho 64-19914 and Japanese Patent Laid-Open No. She 64-039227. The following configuration is described in Japanese Patent Laid-Open No. Sho 64-19914. Specifically, the current flowing to the motor is detected by the current detection circuit 22 provided in the inverter main circuit. Furthermore, a low-level overcurrent due to e.g. motor lock is detected by the low-level current detection circuit 4, and an overcurrent due to e.g. short-circuiting is detected by the high-level current detection circuit 5. If an overcurrent is detected, the motor is stopped.

The following configuration is described in Japanese Patent Laid-open No. 64-039227. Specifically, the short-circuiting of the arm of the inverter is detected by the DC converters 9-1, 9-2, and 9-3 for the U-, V-, and W-phases, and comparisons with reference voltages are made by the comparators 17-1, 17-2, and 17-3 to thereby detect whether or not short-circuiting has occurred, so that protection against short-circuiting is achieved.

However, in Japanese Patent Laid-Open No. Sho 64-19914, in which a low-level overcurrent due to e.g. motor lock is detected by the low-level current detection circuit 4 and an overcurrent due to e.g. short-circuiting is detected by the high-level current detection circuit 5, in order to protect the motor against a system malfunction, an overcurrent is detected for the U-, V-, and W-phases. In addition, in the case of making comparisons with reference voltages, the comparison with the reference voltage needs to be made for each phase by the comparators, and therefore six comparators are required. Thus, the number of comparators is large, which leads to a problem that the cost is high.

Furthermore, in Japanese Patent Laid-Open No. Sho 64-039227, the comparisons with the reference voltages need to be made by the comparators in order to detect short-circuiting for each of the U-, V-, and W-phases. This also causes a problem that the number of comparators is large and therefore the cost is high.

SUMMARY OF THE INVENTION

An object of the present invention is made in view of the above description and is to provide a multi-output determination circuit that allows reduction in the number of comparators and hence reduction in the cost.

According to a first aspect of the present invention, there is provided a multi-output determination circuit that determines whether or not any one input voltage of a plurality of input voltages is equal to or higher than an upper-limit voltage value or equal to or lower than a lower-limit voltage value, the multi-output determination circuit comprising: a maximum level detection circuit that detects a maximum value of the plurality of input voltages; a minimum level detection circuit that detects a minimum value of the plurality of input voltages; a first comparator that compares an output of the maximum level detection circuit with an upper-limit reference voltage corresponding to the upper-limit voltage value; and a second comparator that compares an output of the minimum level detection circuit with a lower-limit reference voltage corresponding to the lower-limit voltage value.

According to a second aspect of the present invention, in the first aspect of the present invention, the maximum level detection circuit is formed of a first diode-OR including a plurality of first diodes whose anodes are each connected to a respective one of the plurality of input voltages and whose cathodes are connected in common, and the minimum level detection circuit is formed of a second diode-OR including a plurality of second diodes whose cathodes are each connected to a respective one of the plurality of input voltages and whose anodes are connected in common.

According to a third aspect of the present invention, in the second aspect of the present invention, the multi-output determination circuit further comprises an upper-limit reference voltage generation circuit that has a first resistor, a third diode, and a second resistor that are connected in series between first and second power supply potentials, and generates the upper-limit reference voltage based on voltage of a cathode of the third diode.

According to a fourth aspect of the present invention, in the third aspect of the present invention, the multi-output determination circuit further comprises a lower-limit reference voltage generation circuit that has a third resistor, a fourth diode, and a fourth resistor that are connected in series between the first and second power supply potentials, and generates the lower-limit reference voltage based on voltage of an anode of the fourth diode.

According to a fifth aspect of the present invention, in the third aspect of the present invention, the plurality of first diodes and the third diode are mounted in the same package.

According to a sixth aspect of the present invention, in the third aspect of the present invention, the plurality of first diodes and the third diode are mounted in a plurality of packages and the plurality of packages are mounted on the same conductor pattern formed over a substrate.

According to a seventh aspect of the present invention, in the third aspect of the present invention, a ratio of voltage division by the first and second resistors is so decided that an output voltage of the first diode-OR obtained when a maximum value of the plurality of input voltages is equal to the upper-limit voltage value is equal to the upper-limit reference voltage when both forward drop voltage of the plurality of first diodes and forward drop voltage of the third diode are a predetermined voltage.

According to a eighth aspect of the present invention, in the fourth aspect of the present invention, a ratio of voltage division by the third and fourth resistors is so decided that an output voltage of the second diode-OR obtained when a minimum value of the plurality of input voltages is equal to the lower-limit voltage value is equal to the lower-limit reference voltage when both forward drop voltage of the plurality of second diodes and forward drop voltage of the fourth diode are a predetermined voltage.

According to a ninth aspect of the present invention, in the fourth aspect of the present invention, the plurality of second diodes and the fourth diode are mounted in the same package.

According to a tenth aspect of the present invention, in the fourth aspect of the present invention, the plurality of second diodes and the fourth diode are mounted in a plurality of packages and the plurality of packages are mounted on the same conductor pattern formed over a substrate.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
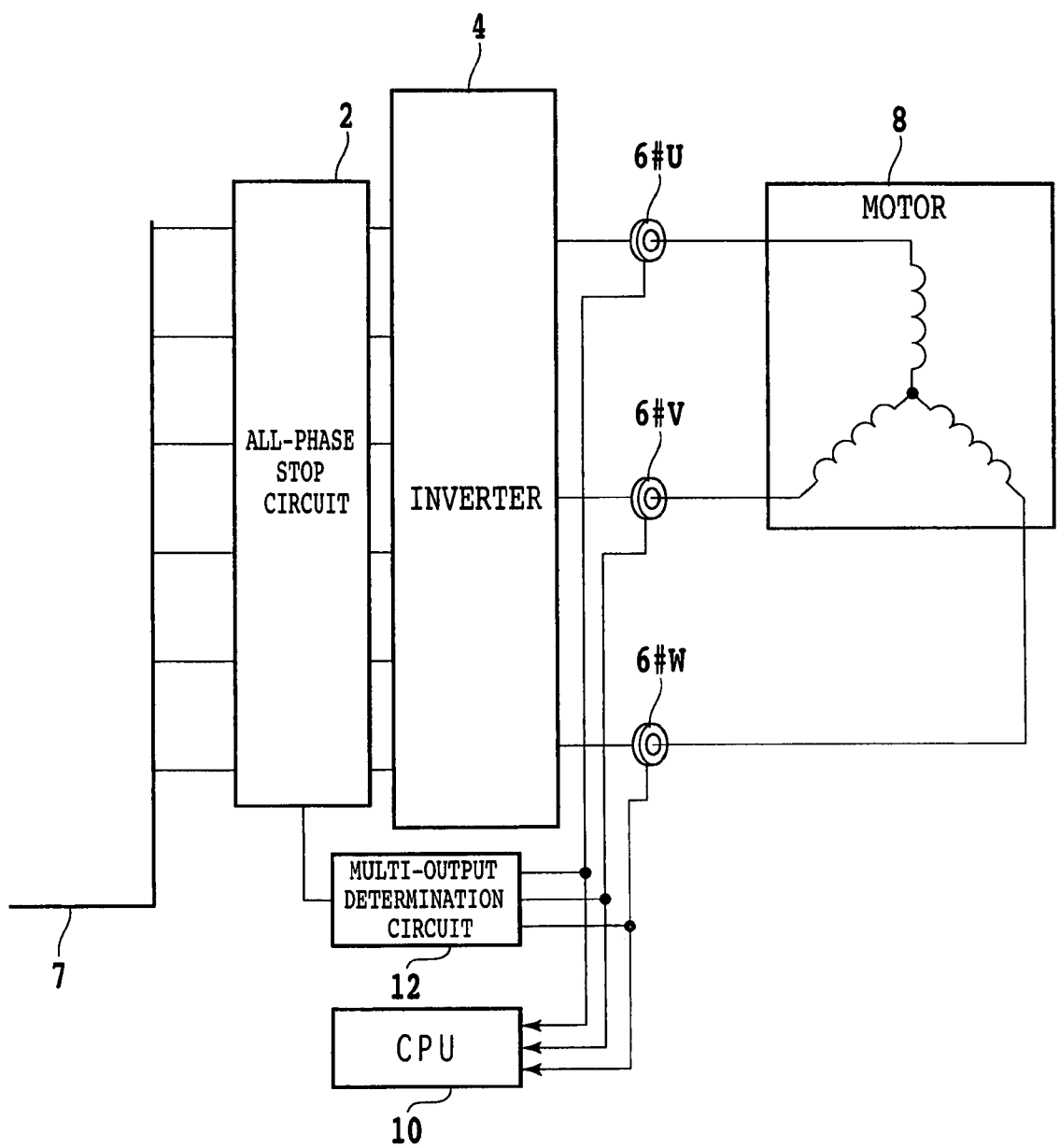
FIG. 1 is a schematic configuration diagram of a hybrid vehicle according to an embodiment of the present invention.

FIG. 1 is a schematic configuration diagram of a hybrid vehicle as an electric vehicle according to an embodiment of the present invention. As shown in FIG. 1, the hybrid vehicle includes an all-phase stop circuit 2, an inverter 4, phase current detection sensors 6#U, 6#V, and 6#W, a motor 8, a CPU 10, a multi-output determination circuit 12, and so on.

The all-phase stop circuit 2 is hardware having the following function. Specifically, the all-phase stop circuit 2 turns off all of the switch elements in the inverter 4 to thereby stop all of the phases if it is determined by the multi-output determination circuit 12 that any of the U-, V-, and W-phase currents detected by the phase current detection sensors 6#U, 6#V, and 6#W is equal to or larger than the upper-limit current value of overcurrent determination or equal to or smaller than the lower-limit current value of overcurrent determination and thus an overcurrent is detected. When all of the U-, V-, and W-phase currents are smaller than the upper-limit value and larger than the lower-limit value, a gate signal by a PWM modulation system is input to the all-phase stop circuit 2 from a harness 7 and the all-phase stop circuit 2 outputs the gate signal to the gates of the switch elements in the inverter 4.

The inverter 4 includes, for each of the U-, V-, and W-phases, plural switch elements connected in series to each other and plural free-wheel diodes connected in anti-parallel to the respective switch elements for the high-side and the low-side. The inverter 4 converts DC power from a high-voltage battery to AC power of three phases of the U-, V-, and W-phases and outputs the AC power to motor coils to thereby drive the motor 8. Furthermore, the inverter 4 converts three-phase AC power generated by the motor 8 to DC power and charges the high-voltage battery by the DC power.

The phase current detection sensors 6#U, 6#V, and 6#W detect the phase currents flowing to the U-, V-, and W-phase coils of the motor 8 and outputs electric signals with the voltage levels corresponding to the phase currents to the CPU 10, the multi-output determination circuit 12, and so on. The output shaft of the motor 8 is coupled to the crankshaft of an engine (not shown), and e.g. a three-phase brushless motor is used as the motor 8. When being driven, the motor 8 is supplied with AC power, e.g. three-phase AC power, by the inverter 4 and operates as an electric machine. The driving of the electric machine activates the engine and assists the driving force of the engine. Furthermore, at the time of regeneration, kinetic energy is converted to power and the power is converted to a DC voltage by the inverter 4 to thereby charge the battery.

The CPU 10 outputs a control signal applied to the gates in the inverter 4 by a PWM modulation system based on the phase currents detected by the phase current detection sensors 6#U, 6#V, and 6#W, the motor rotation angle output by a motor rotation angle readout sensor, and so on.

The multi-output determination circuit 12 determines whether or not any of the phase currents detected by the phase current detection sensors 6#U, 6#V, and 6#W is equal to or larger than an upper-limit voltage value VU as the output voltage of the phase current detection sensors 6#U, 6#V, and 6#W corresponding to the upper-limit current value of overcurrent determination or equal to or smaller than a lower-limit voltage value VL as the output voltage of the phase current detection sensors 6#U, 6#V, and 6#W corresponding to the lower-limit current value of overcurrent determination. Thereby, the multi-output determination circuit 12 detects an overcurrent and notifies the all-phase stop circuit 2 of the malfunction if an overcurrent is detected.

Figure 2:
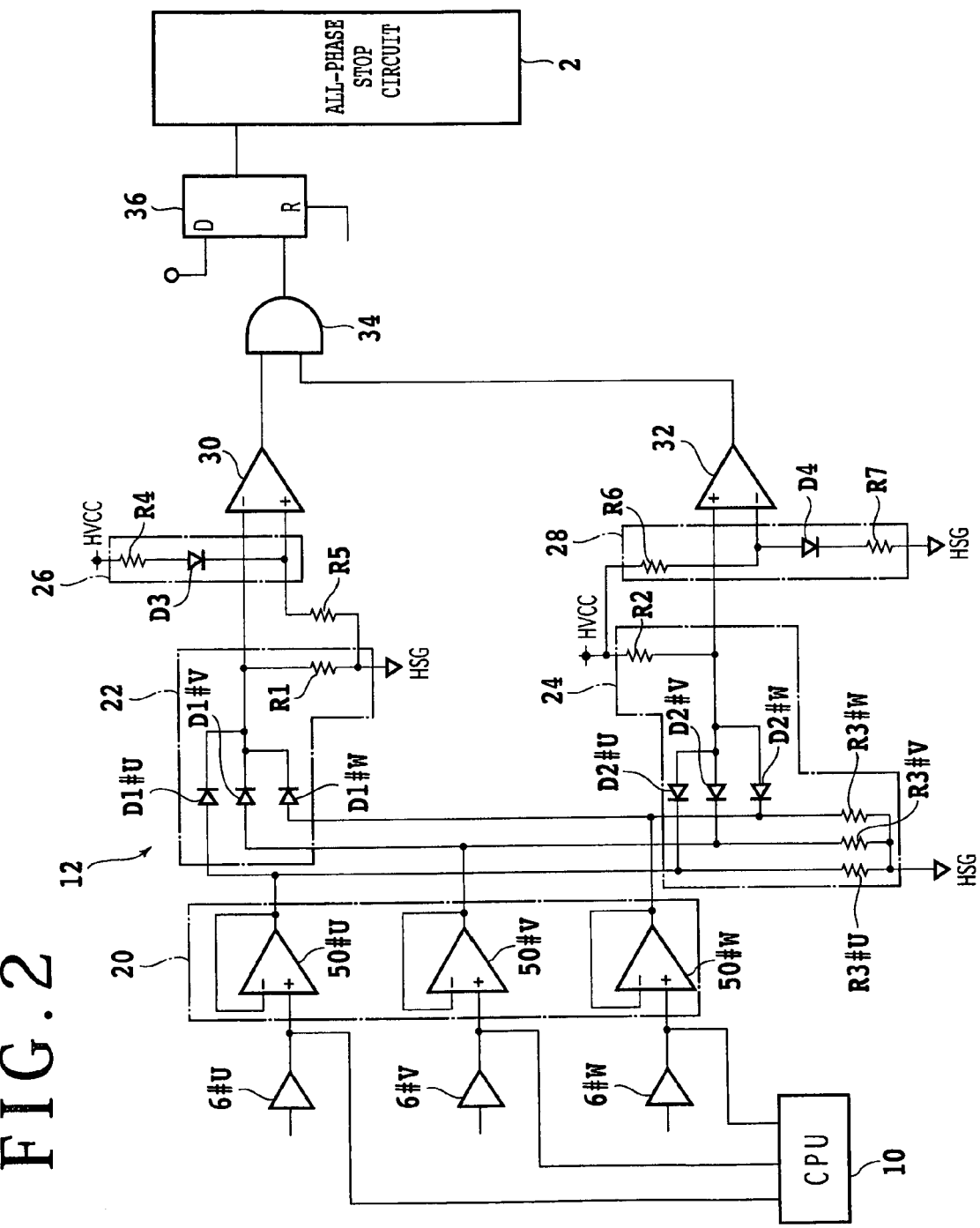
FIG. 2 is a circuit diagram of a multi-output determination circuit according to the embodiment of the present invention.

FIG. 2 is a configuration diagram of the multi-output determination circuit 12 in FIG. 1. The multi-output determination circuit 12 includes an input buffer 20, diode-ORs 22 and 24, an upper-limit reference voltage generation circuit 26, a lower-limit reference voltage generation circuit 28, comparators 30 and 32, an AND gate 34, and a latch circuit 36.

The input buffer 20 is a high-impedance buffer having operational amplifiers 50#U, 50#V, and 50#W. The operational amplifiers 50#U, 50#V, and 50#W are each a voltage follower whose voltage gain is one. The non-inverting terminals (+) thereof are connected to the outputs of the phase current detection sensors 6#U, 6#V, and 6#W, and the inverting terminals (−) thereof are connected to the output terminals of the operational amplifiers 50#U, 50#V, and 50#W.

The purpose of the provision of the input buffer 20 is to set high impedance as the impedance seen from the outputs of the phase current detection sensors 6#U, 6#V, and 6#W in order to prevent the outputs of the phase current detection sensors 6#U, 6#V, and 6#W from affecting the input signals to the CPU 10 and so on, because the outputs of the phase current detection sensors 6#U, 6#V, and 6#W are connected to the CPU 10 and a load (not shown) in addition to the multi-output determination circuit 12.

The diode-OR (first diode-OR) 22 is a maximum level detection circuit that detects the maximum value of the output voltages of the phase current detection sensors 6#U, 6#V, and 6#W (hereinafter, the maximum voltage value). The diode-OR 22 has plural diodes D1#U, D1#V, and D1#W and a resistor R1. The anodes of the diodes (first diodes) D1#U, D1#V, and D1#W are connected to the outputs of the operational amplifiers 50#U, 50#V, and 50#W, and the cathodes thereof are connected to one terminal of the resistor R1 in common. One terminal of the resistor R1 is connected to the cathodes of the diodes D1#U, D1#V, and D1#W, and the other terminal thereof is connected to ground HSG.

The diode D1#U, D1#V, or D1#W corresponding to the maximum voltage value of the voltages applied to the anodes of the diodes D1#U, D1#V, and D1#W is forward biased and turned on, so that a current flows to the ground HSG via the resistor R1.

The voltage of the cathode of the turned-on diode (output voltage) is (the maximum voltage value−Vf) (Vf is the forward drop voltage of the diodes D1#U, D1#V, and D1#W), and the diodes D1#U, D1#V, and D1#W except the diode corresponding to the maximum voltage value are reverse biased and turned off.

The diode-OR (second diode-OR) 24 is a minimum level detection circuit that detects the minimum value of the output voltages of the phase current detection sensors 6#U, 6#V, and 6#W (hereinafter, the minimum voltage value). The diode-OR 24 has diodes (second diodes) D2#U, D2#V, and D2#W and resistors R2, R3#U, R3#V, and R3#W.

The anodes of the diodes D2#U, D2#V, and D2#W are connected to one terminal of the resistor R2 in common, and each of the cathodes thereof is connected to the output of a respective one of the operational amplifiers 50#U, 50#V, and 50#W and one terminal of a respective one of the resistors R3#U, R3#V, and R3#W. One terminal of the resistor R2 is connected to the anodes of the diodes D2#U, D2#V, and D2#W in common, and the other terminal thereof is connected to a power supply HVCC. One terminal of each of the resistors R3#U, R3#V, and R3#W is connected to the cathode of a respective one of the diodes D2#U, D2#V, and D2#W, and the other terminals thereof are connected to the ground HSG.

The diode D2#U, D2#V, or D2#W corresponding to the minimum voltage value of the voltages applied to the anodes of the diodes D2#U, D2#V, and D2#W is forward biased and turned on, so that a current flows from the resistor R2 to the ground HSG via the turned-on diode D2#U, D2#V, or D2#W and the corresponding resistor R3#U, R3#V, or R3#W.

The voltage of the anode of the turned-on diode (output voltage) is (the minimum voltage value+Vf) (Vf is the forward drop voltage of the diodes D2#U, D2#V, and D2#W), and the diodes D2#U, D2#V, and D2#W except the diode corresponding to the minimum voltage value are reverse biased and turned off.

At this time, the voltage of the corresponding resistor R3#U, R3#V, or R3#W increases by the amount corresponding to the current flow from the resistor R2 to the corresponding resistor R3#U, R3#V, or R3#W, so that the voltage of the cathode of the corresponding diode D2#U, D2#V, or D2#W increases. Thus, the following relationship is obtained: the resistor R2>>the corresponding resistor R3#U, R3#V, or R3#W. This yields a very-small current as the flowing current.

The upper-limit reference voltage generation circuit 26 is a circuit that generates an upper-limit reference voltage Vref1, and has a resistor R4, a diode D3, and a resistor R5 that are connected in series to each other. One terminal of the resistor (first resistor) R4 is connected to the power supply (first power supply potential) HVCC, and the other terminal thereof is connected to the anode of the diode D3.

The anode of the diode (third diode) D3 is connected to the other terminal of the resistor R4, and the cathode thereof is connected to the positive terminal of the comparator 30 and one terminal of the resistor R5. One terminal of the resistor (second resistor) R5 is connected to the cathode of the diode D3 and the positive terminal of the comparator 30, and the other terminal thereof is connected to the ground (second power supply potential) HSG.

Because the output voltage of the diode-OR 22 is (the maximum voltage value−Vf) and thus depends on the forward drop voltage Vf, the diode D3 corrects the upper-limit reference voltage Vref1 depending on the forward drop voltage Vf. Specifically, if Vf is regarded as zero and a constant value is employed as the upper-limit reference voltage Vref1, it is impossible to accurately make a determination as to whether or not the maximum voltage value is equal to or larger than the upper-limit voltage value because the output voltage of the diode-OR 22 changes depending on Vf even when the maximum voltage value is the same. Therefore, the diode D3 corrects the upper-limit reference voltage Vref1 in accordance with change in the output voltage of the diode-OR 22 dependent on Vf.

The upper-limit reference value Vref1 is calculated as represented by the following equation (1).

$$Vref1 = (HVCC - Vf') \times R5/(R4+R5) \qquad (1)$$

In equation (1), HVCC denotes the voltage of the power supply HVCC and Vf' denotes the forward drop voltage of the diode D3.

By employing diodes having the same characteristics, i.e. same-type components, as the diode D3 and the diodes D1#U, D1#V, and D1#W, the forward drop voltage Vf' of the diode D3 is equalized with the forward voltage Vf of the diodes D1#U, D1#V, and D1#W. The forward drop voltage of the diodes D2#U, D2#V, and D2#W and the diode D3 will be represented as Vf.

Figure 3:
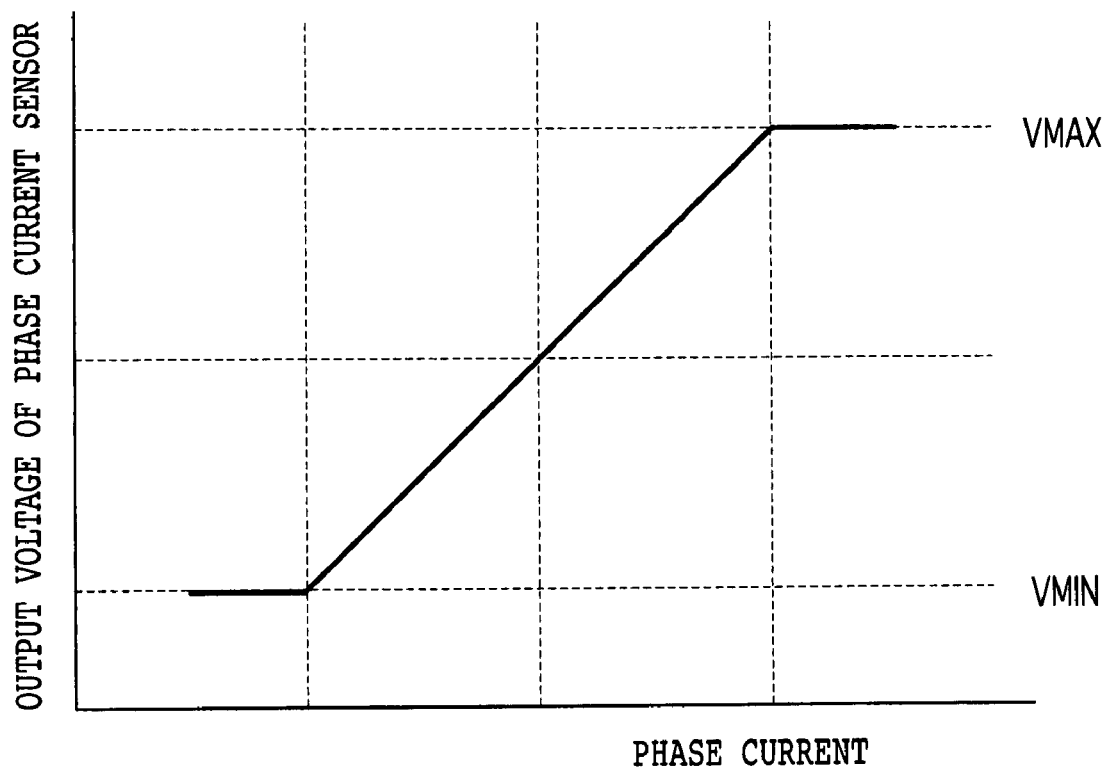
FIG. 3 is a diagram for explaining an upper-limit voltage value and a lower-limit voltage value.

FIG. 3 is a diagram for explaining the upper-limit voltage value and the lower-limit voltage value. In FIG. 3, the phase current is plotted on the abscissa and the output voltage of the phase current detection sensors 6#U, 6#V, and 6#W is plotted on the ordinate. When the detected current value is equal to or larger than a certain current value, e.g. the positive upper-limit current value, the phase current detection sensors 6#U, 6#V, and 6#W output the maximum voltage VMAX, e.g. 4.5 V. When the current value is equal to or smaller than a certain current value, e.g. the negative lower-limit current value, they output the minimum voltage VMIN, e.g. 0.5 V. When the current value is zero, they output an intermediate voltage between the maximum voltage VMAX and the minimum voltage VMIN, e.g. 2.5 V.

The upper-limit voltage value VU and the lower-limit voltage value VL can be arbitrarily set between the maximum voltage VMAX and the minimum voltage VMIN depending on the output voltage of the phase current detection sensors 6#U, 6#V, and 6#W corresponding to the upper-limit current value of overcurrent determination and the output voltage of the phase current detection sensors 6#U, 6#V, and 6#W corresponding to the lower-limit current value of overcurrent determination.

Vf has temperature dependency and thus changes depending on the temperature. For example, Vf changes in the range of about 0.1 to 1 V. The ratio of the voltage division by the resistors R4 and R5 is so set that the upper-limit reference voltage Vref1 is equal to (VU−Vf0) when Vf is the predetermined forward drop voltage Vf0, e.g. 0.6 V.

Due to this setting, Vref1 is equal to (VU−Vf0) with the predetermined forward drop voltage Vf0. In addition, across a wide range of the forward drop voltage Vf, the difference between (VU−Vf) and the upper-limit reference voltage Vref1 corresponding to Vf, represented by equation (1), is substantially zero. This allows accurate detection as to whether or not the maximum voltage value is equal to or larger than the upper-limit voltage value VU.

Figure 4:
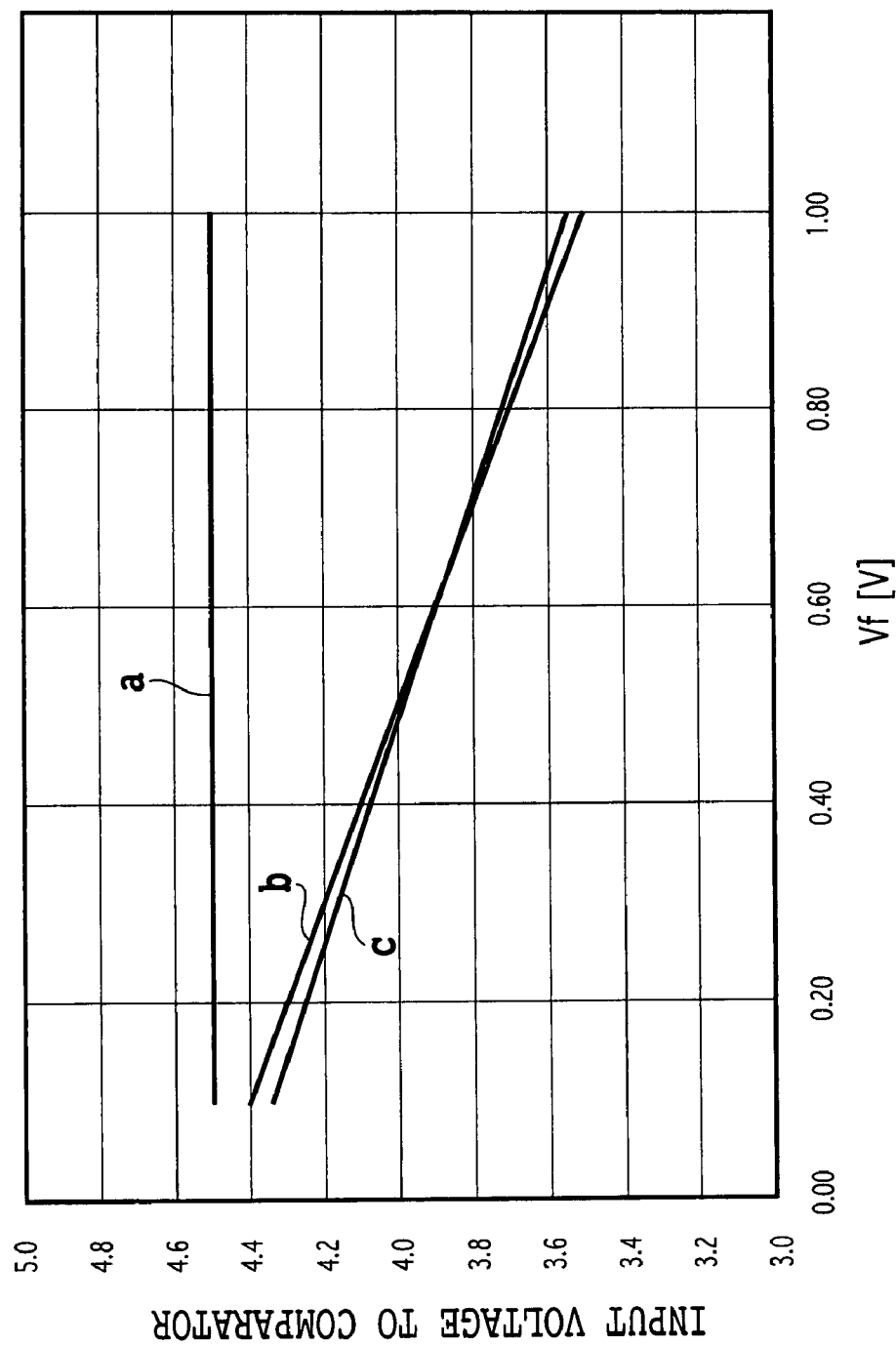
FIG. 4 is a diagram showing the relationship between a forward drop voltage Vf and an upper-limit reference voltage Vref1.

FIG. 4 is a diagram showing the relationship between the forward drop voltage Vf and the upper-limit reference voltage Vref1 under a condition of HVCC=5 V and VU=4.5 V. Symbol a denotes the upper-limit reference voltage when Vf is regarded as zero and the correction dependent on Vf is not carried out. This upper-limit reference voltage is constant at 4.5 V. Symbol b denotes the input voltage to the negative terminal of the comparator 30 when the maximum voltage value is equal to the upper-limit voltage value of 4.5 V. This input voltage is (4.5−Vf). Symbol c denotes the upper-limit reference voltage Vref1 that is represented by equation (1) and results from the Vf-dependent correction for which Vf=0.6 is used as the basis.

When Vf is equal to 0.6 V, the upper-limit reference voltage Vref1 is equal to the input voltage to the comparator 30 (3.9 V) as shown by b and c. Furthermore, even when Vf is equal to 0.10 V or 1.00 V, the difference between the upper-limit reference voltage Vref1 and the input voltage to the comparator 30 is about 0.06 V as shown by b and c. Accordingly, the detection accuracy is not deteriorated although the forward drop voltage Vf changes. In contrast, when the correction dependent on the forward drop voltage Vf is not carried out, the difference between the input voltage and the upper-limit reference voltage increases as the forward drop voltage Vf becomes higher as shown by a and b, and therefore the detection accuracy is deteriorated.

The detection accuracy is further enhanced if the operating environments of the diodes D1#U, D1#V, and D1#W and the diode D3 are equalized and thereby the forward drop voltages Vf thereof are made identical to each other.

Figure 5A:
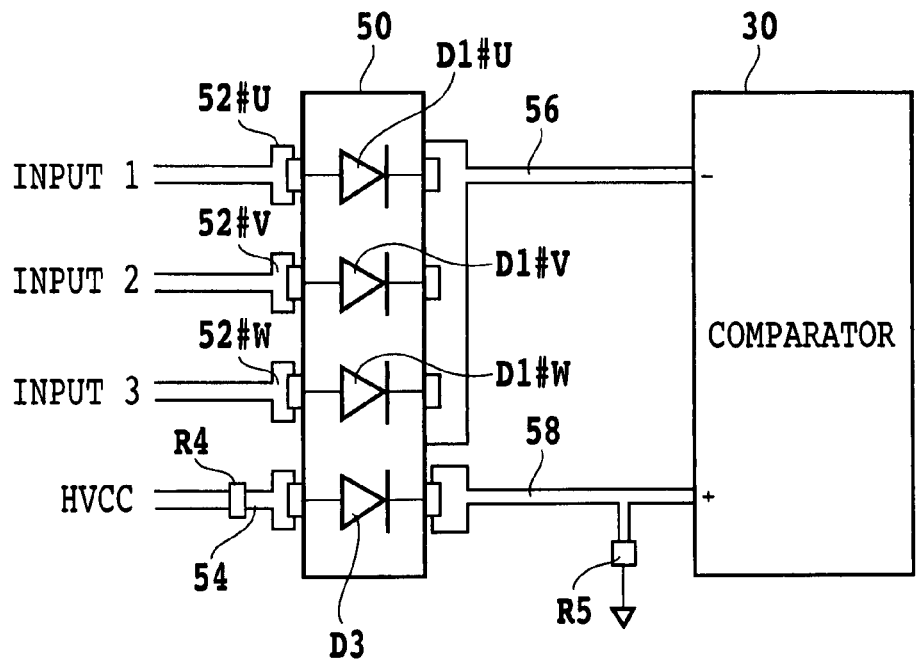
FIG. 5A is a diagram showing mounting of diodes according to the embodiment of the present invention.
Figure 5B:
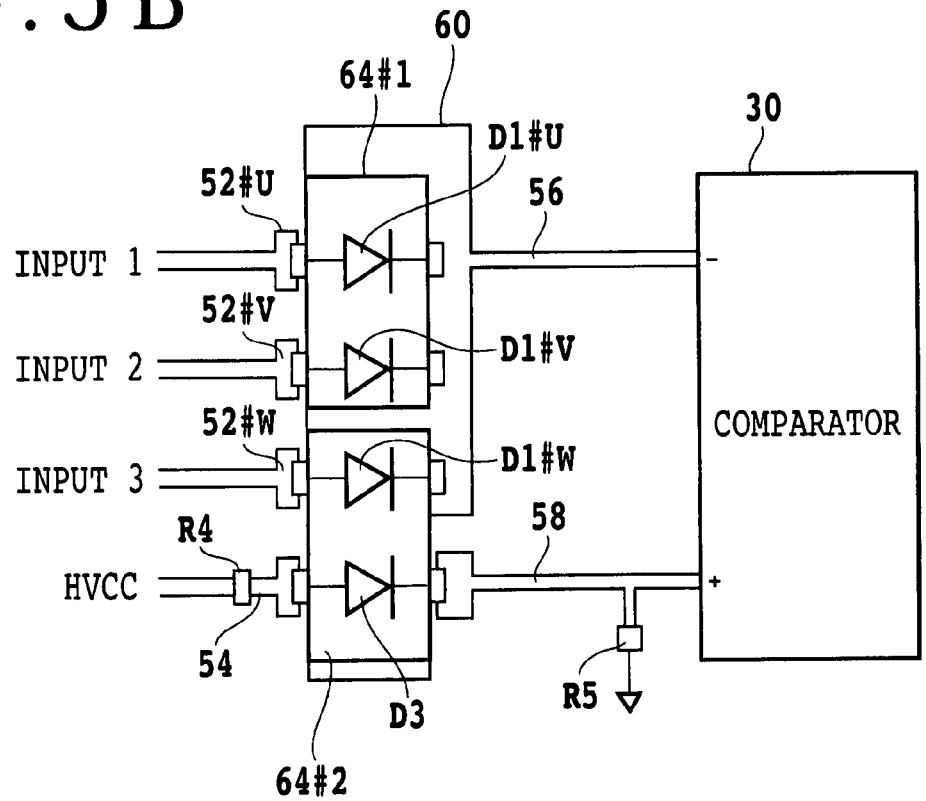
FIG. 5B is a diagram showing mounting of diodes according to the embodiment of the present invention.

FIG. 5A and FIG. 5B are diagrams showing a mounting method for equalizing the operating environments of the diodes D1#U, D1#V, and D1#W and the diode D3. As shown in FIG. 5A, the diodes D1#U, D1#V, D1#W, and D3 are mounted in the same package 50. The input pins (anodes) of the diodes D1#U, D1#V, and D1#W are connected to patterns 52#U, 52#V, and 52#W, respectively. The input pin (anode) of the diode D3 is connected to the power supply HVCC via the resistor R4 by a pattern 54.

The output pins (cathodes) of the diodes D1#U, D1#V, and D1#W are connected to the negative terminal of the comparator 30 via a pattern 56. The output pin (cathode) of the diode D3 is connected to the resistor R5 and the positive terminal of the comparator 30 via a pattern 58. By mounting the diodes D1#U, D1#V, D1#W, and D3 in the same package in this manner, the operating environments of the diodes D1#U, D1#V, D1#W, and D3 are equalized, and thus the forward drop voltages Vf of the diodes D1#U, D1#V, D1#W, and D3 are made identical to each other.

In the structure shown in FIG. 5B, the diodes D1#U and D1#V are mounted in a package 64#1, and the diodes D1#W and D3 are mounted in a package 64#2. The packages 64#1 and 64#2 are mounted on a conductor pattern 60. The connection of the input pins of the diodes D1#U, D1#V, D1#W, and D3 is the same as that of FIG. 5A.

The output pins of the diodes D1#U, D1#V, and D1#W are connected to the negative terminal of the comparator 30 via the pattern 60. The connection of the output pin of the diode D3 is the same as that of FIG. 5A. By mounting the packages 64#1 and 64#2 on the conductor pattern 60 having favorable thermal conductivity in this manner, the operating environments of the diodes D1#U, D1#V, D1#W, and D3 are equalized, and thus the forward drop voltages Vf of the diodes D1#U, D1#V, D1#W, and D3 are made identical to each other.

The lower-limit reference voltage generation circuit 28 is a circuit that generates a lower-limit reference voltage Vref2, and has a resistor R6, a diode D4, and a resistor R7 that are connected in series to each other. One terminal of the resistor (third resistor) R6 is connected to the power supply (first power supply potential) HVCC, and the other terminal thereof is connected to the negative terminal of the comparator 32 and the anode of the diode D4. The anode of the diode (fourth diode) D4 is connected to the other terminal of the resistor R6 and the negative terminal of the comparator 32, and the cathode thereof is connected to one terminal of the resistor R7. One terminal of the resistor (fourth resistor) R7 is connected to the cathode of the diode D4, and the other terminal thereof is connected to the ground (second power supply potential) HSG.

Because the output voltage of the diode-OR 24 is (the minimum voltage value+Vf) and thus depends on the forward drop voltage Vf, the diode D4 corrects the lower-limit reference voltage Vref2 depending on Vf. Specifically, if Vf is regarded as zero and a constant value is employed as the lower-limit reference voltage Vref2, it is impossible to accurately make a determination as to whether or not the minimum voltage value is equal to or smaller than the lower-limit voltage value because the output voltage of the diode-OR 24 changes depending on Vf even when the minimum voltage value is the same. Therefore, the diode D4 corrects the lower-limit reference voltage Vref2 in accordance with change in the output voltage of the diode-OR 24 dependent on Vf.

The lower-limit reference value Vref2 is calculated as represented by the following equation (2).

$$Vref2 = (HVCC - Vf) \times R7/(R6+R7) + Vf \qquad (2)$$

In equation (2), HVCC denotes the voltage of the power supply HVCC, and Vf denotes the forward drop voltage of the diode D4. By employing diodes having the same characteristics, i.e. same-type components, as the diode D4 and the diodes D2#U, D2#V, and D2#W, the forward drop voltage of the diode D4 is equalized with the forward voltage of the diodes D2#U, D2#V, and D2#W.

Vf has temperature dependency and thus changes depending on the temperature. For example, the forward drop voltage Vf changes in the range of about 0.1 to 1 V. The ratio of the voltage division by the resistors R6 and R7 is so set that the lower-limit reference voltage Vref2 is equal to (VL+Vf0) when Vf is the predetermined forward drop voltage Vf0, e.g. 0.6 V. Due to this setting, Vref2 is equal to (VL+Vf0) with the predetermined forward drop voltage Vf0. In addition, across a wide range of the forward drop voltage Vf, the difference between (VL+Vf) and Vref2 corresponding to Vf, represented by equation (2), is substantially zero. This allows accurate detection as to whether or not the minimum voltage value is equal to or smaller than the lower-limit voltage value VL.

Figure 6:
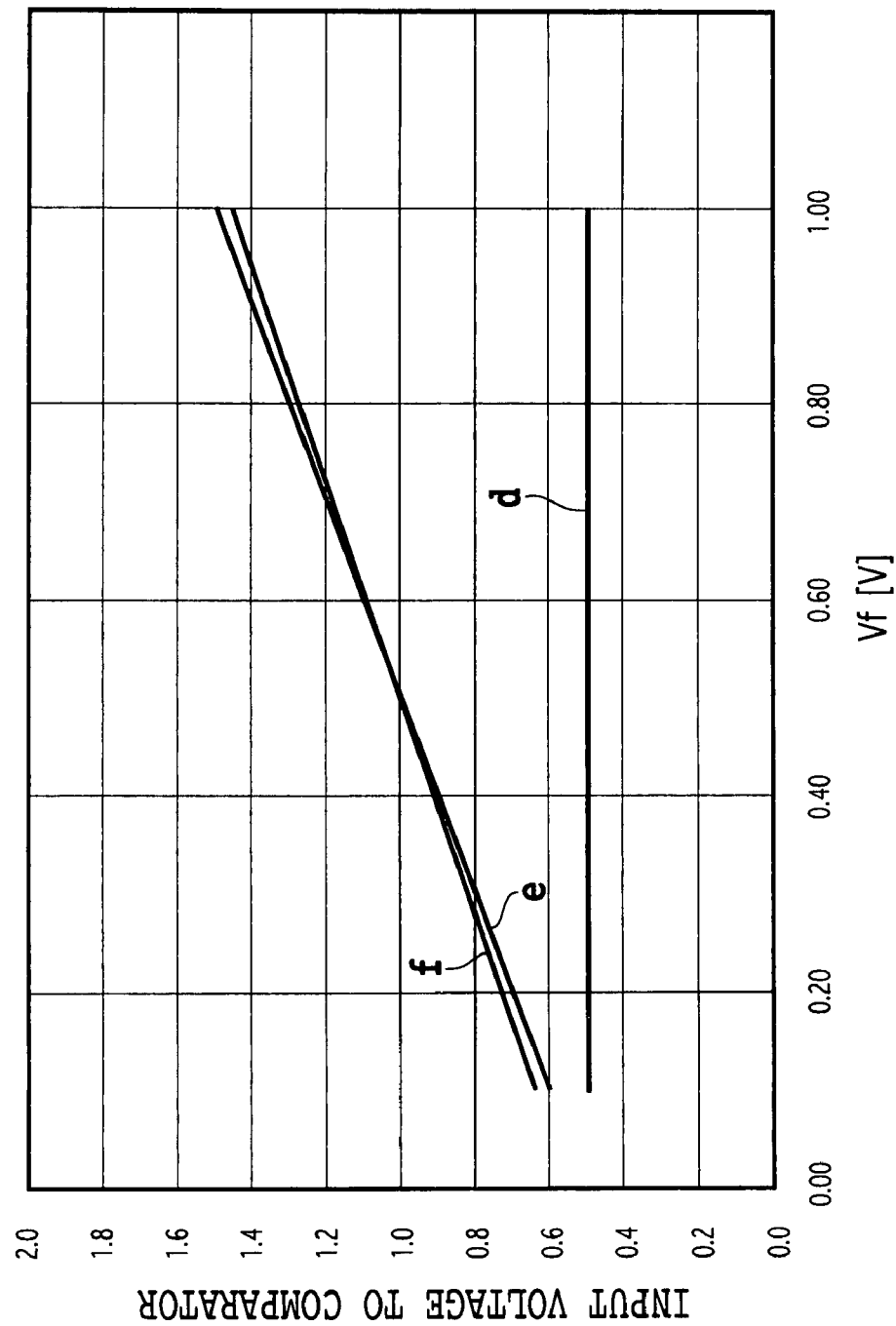
FIG. 6 is a diagram showing the relationship between the forward drop voltage Vf and a lower-limit reference voltage Vref2.

FIG. 6 is a diagram showing the relationship between the forward drop voltage Vf and the lower-limit reference voltage Vref2 under a condition of HVCC=5 V and VL=0.5 V. Symbol d denotes the lower-limit reference voltage when Vf is regarded as zero and the correction dependent on Vf is not carried out. This lower-limit reference voltage is constant at 0.5 V. Symbol e denotes the input voltage to the positive terminal of the comparator 32 when the minimum voltage value is equal to the lower-limit voltage value of 0.5 V. This input voltage is (0.5+Vf). Symbol f denotes the lower-limit reference voltage Vref2 that is represented by equation (2) and results from the correction dependent on the forward drop voltage Vf for which Vf=0.6 is used as the basis.

When Vf is equal to 0.6 V, the lower-limit reference voltage Vref2 is equal to the input voltage (1.1 V) as shown by e and f. Furthermore, even when Vf is 0.10 V or 1.00 V, the difference between the lower-limit reference voltage Vref2 and the input voltage is about 0.06 V as shown by e and f. Accordingly, the detection accuracy is not deteriorated although the forward drop voltage Vf changes. In contrast, when the correction dependent on the forward drop voltage Vf is not carried out, the difference between the input voltage and the lower-limit reference voltage increases as shown by d and e, and therefore the detection accuracy is deteriorated.

The detection accuracy is enhanced if the operating environments of the diodes D2#U, D2#V, and D2#W and the diode D4 are equalized and thereby the forward drop voltages Vf of the diodes D2#U, D2#V, D2#W, and D4 are made identical to each other. To equalize the operating environments, the diodes D2#U, D2#V, D2#W, and D4 are housed in the same package or plural packages in which the diodes D2#U, D2#V, D2#W, and D4 are housed are mounted on the same conductor pattern, as with the structures of FIG. 5A and FIG. 5B.

The comparators 30 and 32 output '1' when the voltage input to the positive terminal is higher than the voltage input to the negative terminal, and output '0' when the voltage input to the positive terminal is equal to or lower than the voltage input to the negative terminal. The AND circuit 34 takes the AND of the input signals and outputs the resulting signal to the latch circuit 36. The latch circuit 36 is reset by a reset signal input to a reset terminal R and outputs '0' to the all-phase stop circuit 2. When the output of the AND circuit 34 is '0', the latch circuit 36 outputs '1' input to a D terminal to the all-phase stop circuit 2. When the output of the AND circuit 34 is '1', the latch circuit 36 latches it. The output of the latch circuit 36 is connected to the all-phase stop circuit 2.

Figure 7:
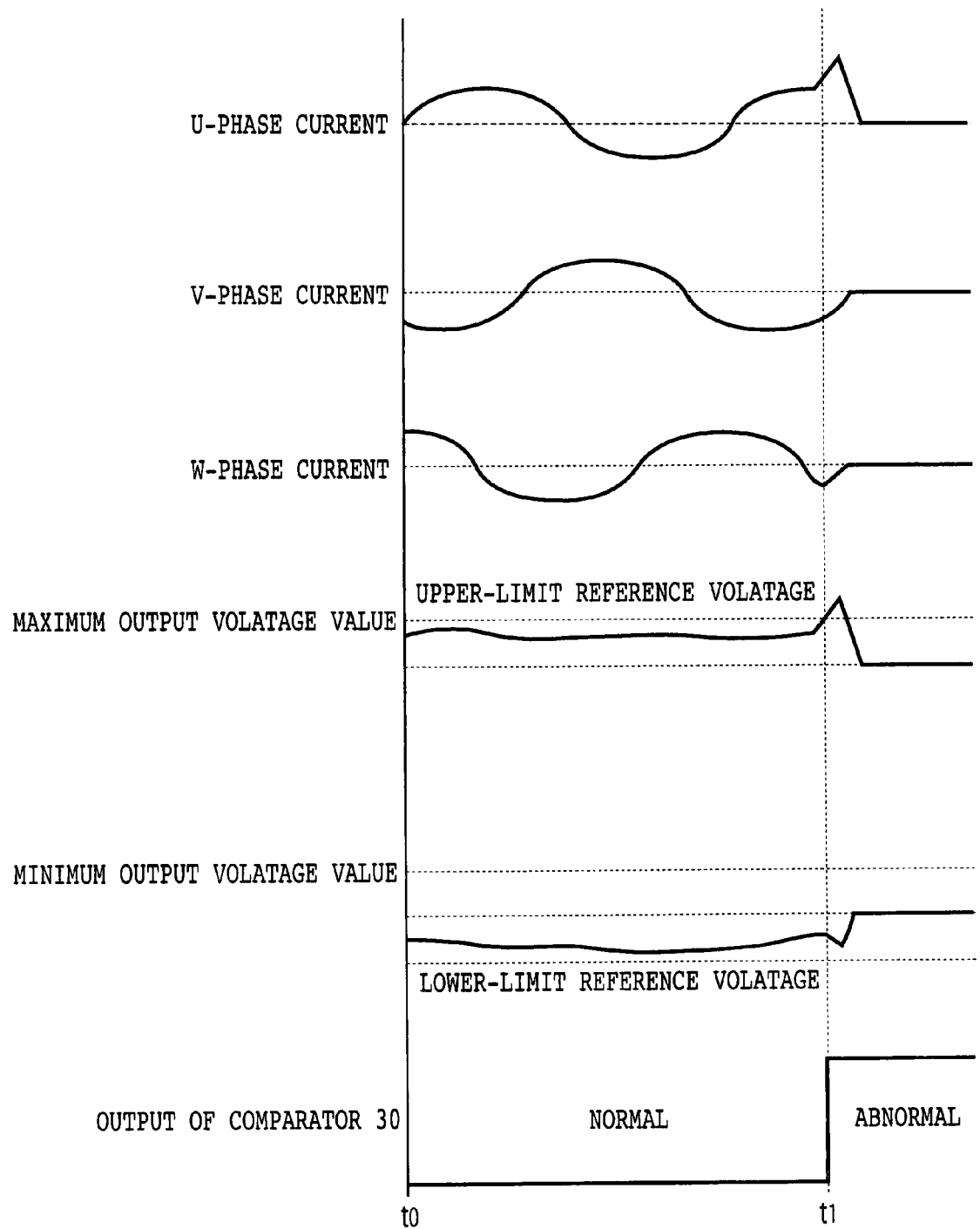
FIG. 7 is a time chart showing a multi-output determination method according to the embodiment of the present invention.
Figure 8:
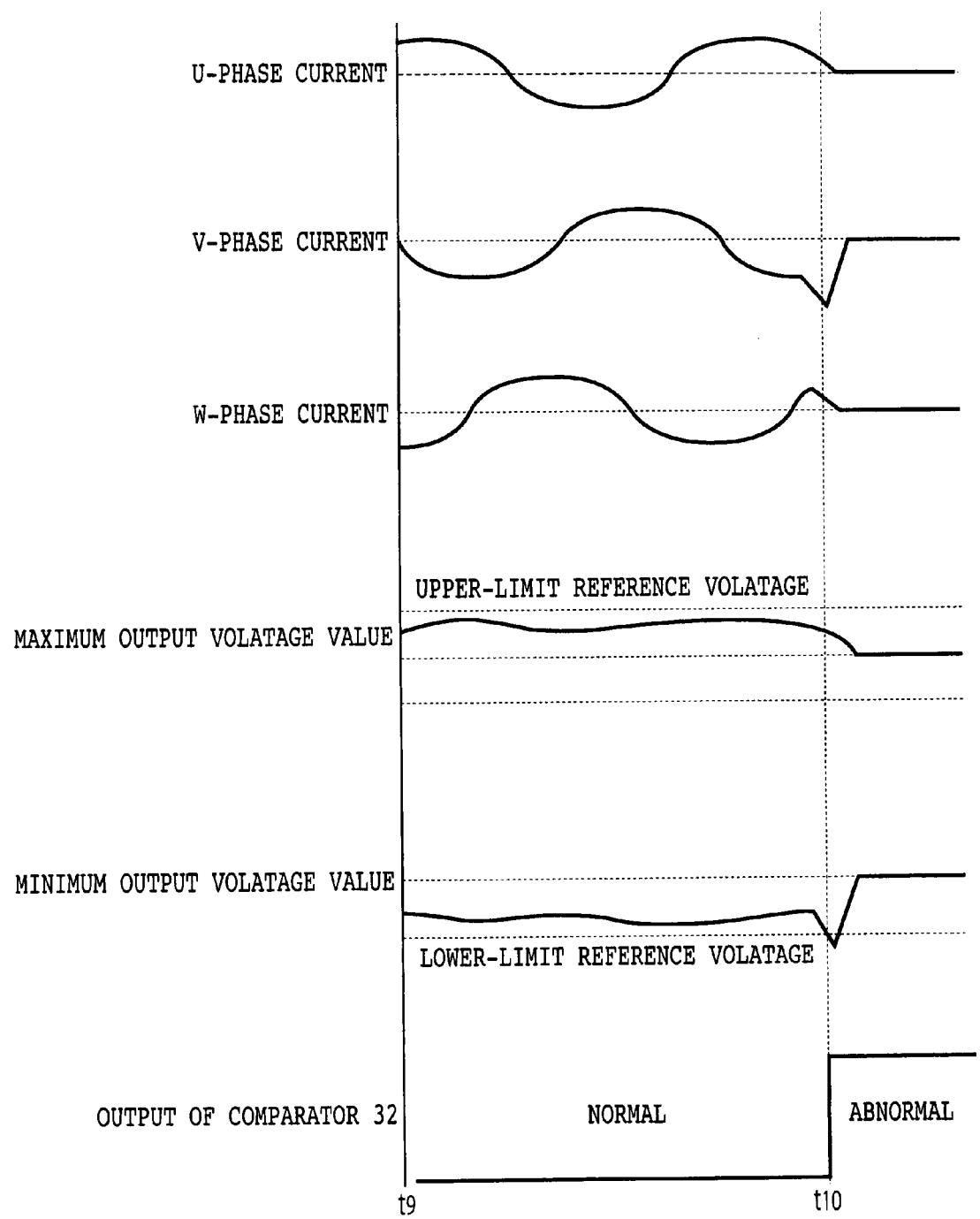
FIG. 8 is a time chart showing the multi-output determination method according to the embodiment of the present invention.

FIGS. 7 and 8 are time charts showing a multi-output determination method. FIG. 7 shows the U-, V-, and W-phase currents, the maximum output voltage value, the minimum output voltage value, and the output of the comparator 30. FIG. 8 shows the U-, V-, and W-phase currents, the maximum output voltage value, the minimum output voltage value, and the output of the comparator 32. The maximum output voltage value Vmax is the output voltage of the diode-OR 22, i.e. ((the maximum value among the output voltages $V_U$, $V_V$, and $V_W$ of the phase current detection sensors 6#U, 6#V, and 6#W)−Vf). The minimum output voltage value Vmin is the output voltage of the diode-OR 24, i.e. ((the minimum value among the output voltages $V_U$, $V_V$, and $V_W$ of the phase current detection sensors 6#U, 6#V, and 6#W)+Vf).

For example, in the period from a time t0 to timing immediately before a time t1 in FIG. 7, the maximum output voltage value Vmax is smaller than the upper-limit reference voltage Vref1 and the minimum output voltage value Vmin is larger than the lower-limit reference voltage Vref2. Therefore, it is determined that the operating state is normal in this period. At the time t1, the U-phase current is larger than the upper-limit current value of overcurrent determination, and therefore the maximum output voltage value Vmax is larger than the upper-limit reference voltage Vref1. Accordingly, it is determined that the operating state is abnormal at the time t1. At this time, the determination that the operating state is abnormal can be accurately made because the upper-limit reference voltage Vref1 results from the Vf-dependent correction.

Furthermore, in the period from a time t9 to timing immediately before a time t10 in FIG. 8, the maximum output voltage value Vmax is smaller than the upper-limit reference voltage Vref1 and the minimum output voltage value Vmin is larger than the lower-limit reference voltage Vref2. Therefore, it is determined that the operating state is normal in this period. At the time t10, the V-phase current is smaller than the lower-limit current value of overcurrent determination, and therefore the minimum output voltage value Vmin is smaller than the lower-limit reference voltage Vref2. Accordingly, it is determined that the operating state is abnormal at the time t10. At this time, the determination that the operating state is abnormal can be accurately made because the lower-limit reference voltage Vref2 results from the Vf-dependent correction.

In the above-described embodiment, the maximum voltage value and the minimum voltage value are calculated by the diode-ORs and the comparisons with the upper-limit reference voltage and the lower-limit reference voltage are made by the comparators. This allows reduction in the number of comparators and hence can achieve cost reduction. Furthermore, the maximum value detection circuit and the minimum value detection circuit can be formed merely through addition of diodes, which also allows cost reduction. The temperature characteristic can be offset by using diodes on the same package or diodes that are thermally coupled with each other on a pattern as the diodes included in the diode-ORs and the diodes in the upper-limit and lower-limit reference voltage generation circuits.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A multi-output determination circuit that determines whether or not any one input voltage of a plurality of input voltages is equal to or higher than an upper-limit voltage value or equal to or lower than a lower-limit voltage value, the multi-output determination circuit comprising:
    a maximum level detection circuit that detects a maximum value of the plurality of input voltages;
    a minimum level detection circuit that detects a minimum value of the plurality of input voltages;
    a first comparator that compares an output of the maximum level detection circuit with an upper-limit reference voltage corresponding to the upper-limit voltage value; and
    a second comparator that compares an output of the minimum level detection circuit with a lower-limit reference voltage corresponding to the lower-limit voltage value, wherein
    the maximum level detection circuit is formed of a first diode-OR including a plurality of first diodes whose anodes are each connected to a respective one of the plurality of input voltages and whose cathodes are connected in common and the minimum level detection circuit is formed of a second diode-OR including a plurality of second diodes whose cathodes are each connected to a respective one of the plurality of input voltages and whose anodes are connected in common.

2. The multi-output determination circuit according to claim 1, further comprising:
an upper-limit reference voltage generation circuit that has a first resistor, a third diode, and a second resistor that are connected in series between first and second power supply potentials, and generates the upper-limit reference voltage based on voltage of a cathode of the third diode.

3. The multi-output determination circuit according to claim 2, further comprising:
a lower-limit reference voltage generation circuit that has a third resistor, a fourth diode, and a fourth resistor that are connected in series between the first and second power supply potentials, and generates the lower-limit reference voltage based on voltage of an anode of the fourth diode.

4. The multi-output determination circuit according to claim 3, wherein
a ratio of voltage division by the third and fourth resistors is so decided that an output voltage of the second diode-OR obtained when a minimum value of the plurality of input voltages is equal to the lower-limit voltage value is equal to the lower-limit reference voltage when both forward drop voltage of the plurality of second diodes and forward drop voltage of the fourth diode are a predetermined voltage.

5. The multi-output determination circuit according to claim 3, wherein
the plurality of second diodes and the fourth diode are mounted in the same package.

6. The multi-output determination circuit according to claim 3, wherein
the plurality of second diodes and the fourth diode are mounted in a plurality of packages and the plurality of packages are mounted on the same conductor pattern formed over a substrate.

7. The multi-output determination circuit according to claim 2, wherein
the plurality of first diodes and the third diode are mounted in the same package.

8. The multi-output determination circuit according to claim 2, wherein
the plurality of first diodes and the third diode are mounted in a plurality of packages and the plurality of packages are mounted on the same conductor pattern formed over a substrate.

9. The multi-output determination circuit according to claim 2, wherein
a ratio of voltage division by the first and second resistors is so decided that an output voltage of the first diode-OR obtained when a maximum value of the plurality of input voltages is equal to the upper-limit voltage value is equal to the upper-limit reference voltage when both forward drop voltage of the plurality of first diodes and forward drop voltage of the third diode are a predetermined voltage.

* * * * *